US011928399B1

(12) United States Patent
Dolan

(10) Patent No.: US 11,928,399 B1
(45) Date of Patent: Mar. 12, 2024

(54) SIMULATING OBJECT OCCLUSIONS

(71) Applicant: Zoox, Inc., Foster City, CA (US)

(72) Inventor: James Graham Dolan, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 321 days.

(21) Appl. No.: 16/581,632

(22) Filed: Sep. 24, 2019

(51) Int. Cl.
| | |
|---|---|
| *G06F 30/20* | (2020.01) |
| *B60W 50/00* | (2006.01) |
| *B60W 60/00* | (2020.01) |
| *G06F 30/15* | (2020.01) |
| *G06T 7/73* | (2017.01) |
| *G06T 15/40* | (2011.01) |
| *G06T 17/00* | (2006.01) |
| *G06V 10/25* | (2022.01) |
| *G06V 20/58* | (2022.01) |

(52) U.S. Cl.
CPC .............. *G06F 30/20* (2020.01); *G06F 30/15* (2020.01); *G06T 15/405* (2013.01); *B60W 2050/0019* (2013.01); *B60W 60/001* (2020.02); *G06T 7/75* (2017.01); *G06T 17/00* (2013.01); *G06T 2207/30244* (2013.01); *G06T 2207/30261* (2013.01); *G06T 2210/12* (2013.01); *G06V 10/25* (2022.01); *G06V 20/58* (2022.01)

(58) Field of Classification Search
CPC ....... G06F 30/20; G06F 30/15; G06T 15/405; G06T 2210/12; G06T 15/20
See application file for complete search history.

(56) References Cited

U.S. PATENT DOCUMENTS

| | | | |
|---|---|---|---|
| 6,111,582 A * | 8/2000 | Jenkins | G06T 15/40 |
| | | | 345/421 |
| 7,710,419 B2 * | 5/2010 | Imagire | G06T 15/005 |
| | | | 345/428 |

(Continued)

FOREIGN PATENT DOCUMENTS

WO    WO2022009707    1/2022

OTHER PUBLICATIONS

Yan Wang, Jing Fu, Xiang-Jing An, Jian Li and Er-Ke Shang, "On the quantitative assessment of the Lane Departure Warning System based on road scenes simulator," 2012 International Conference on Machine Learning and Cybernetics, 2012, pp. 941-948, doi: 10.1109/ICMLC.2012.6359480. (Year: 2012).*

(Continued)

*Primary Examiner* — Akash Saxena
(74) *Attorney, Agent, or Firm* — Lee & Hayes, P.C.

(57) ABSTRACT

Simulating output of a perception system may comprise receiving scenario data indicating a position associated with a simulated sensor and a position and/or identifier of an object, and instantiating a three-dimensional representation of an environment and the object (i.e., a simulated environment). The system may generate depth data indicating distances and/or positions of surfaces in the simulated environment relative to the simulated sensor position and determine a three-dimensional region of interest based at least in part on the depth data associated with at least a portion of the object. In some examples, the three-dimensional region of interest may be smaller than a size of the object, due to an occlusion by topology of the simulated environment and/or another object in the simulated environment.

20 Claims, 7 Drawing Sheets

(56) References Cited

U.S. PATENT DOCUMENTS

| | | | | |
|---|---|---|---|---|
| 8,405,680 | B1* | 3/2013 | Cardoso Lopes | G06T 19/00 345/633 |
| 9,508,191 | B2* | 11/2016 | Tabellion | G06T 15/506 |
| 9,519,997 | B1* | 12/2016 | Ryu | G06T 17/00 |
| 9,626,568 | B2* | 4/2017 | Tang | G06T 7/246 |
| 9,704,055 | B2* | 7/2017 | Holverda | G06T 15/40 |
| 10,109,103 | B2* | 10/2018 | Jenkins | G06T 15/40 |
| 10,513,415 | B2* | 12/2019 | Fang | B66B 1/468 |
| 10,513,416 | B2* | 12/2019 | Fang | B66B 13/26 |
| 10,635,844 | B1* | 4/2020 | Roose | G06F 30/20 |
| 10,733,695 | B2* | 8/2020 | Andersson | G06T 15/405 |
| 2013/0278719 | A1* | 10/2013 | Rusert | G06T 7/596 348/43 |
| 2015/0269770 | A1* | 9/2015 | Jenkins | G06T 15/20 345/421 |
| 2016/0289042 | A1* | 10/2016 | Fang | G06T 7/10 |
| 2017/0109458 | A1* | 4/2017 | Micks | G06F 30/20 |
| 2017/0278303 | A1* | 9/2017 | Groh | G06T 19/20 |
| 2018/0011953 | A1* | 1/2018 | Micks | G06F 30/20 |
| 2019/0318267 | A1* | 10/2019 | Zhang | G06F 30/15 |
| 2020/0353943 | A1* | 11/2020 | Siddiqui | G06T 7/246 |
| 2021/0209797 | A1* | 7/2021 | Lee | G06T 17/00 |
| 2021/0276587 | A1* | 9/2021 | Urtasun | G06F 30/15 |
| 2022/0122322 | A1* | 4/2022 | Wei | G06T 17/20 |
| 2023/0032669 | A1* | 2/2023 | Velankar | G06T 7/70 |
| 2023/0237210 | A1* | 7/2023 | Forshaw | G06F 30/15 703/1 |

OTHER PUBLICATIONS

A. Mousavian, D. Anguelov, J. Flynn and J. Košecká, "3D Bounding Box Estimation Using Deep Learning and Geometry," 2017 IEEE Conference on Computer Vision and Pattern Recognition (CVPR), 2017, pp. 5632-5640, doi: 10.1109/CVPR.2017.597. (Year: 2017).*

* cited by examiner

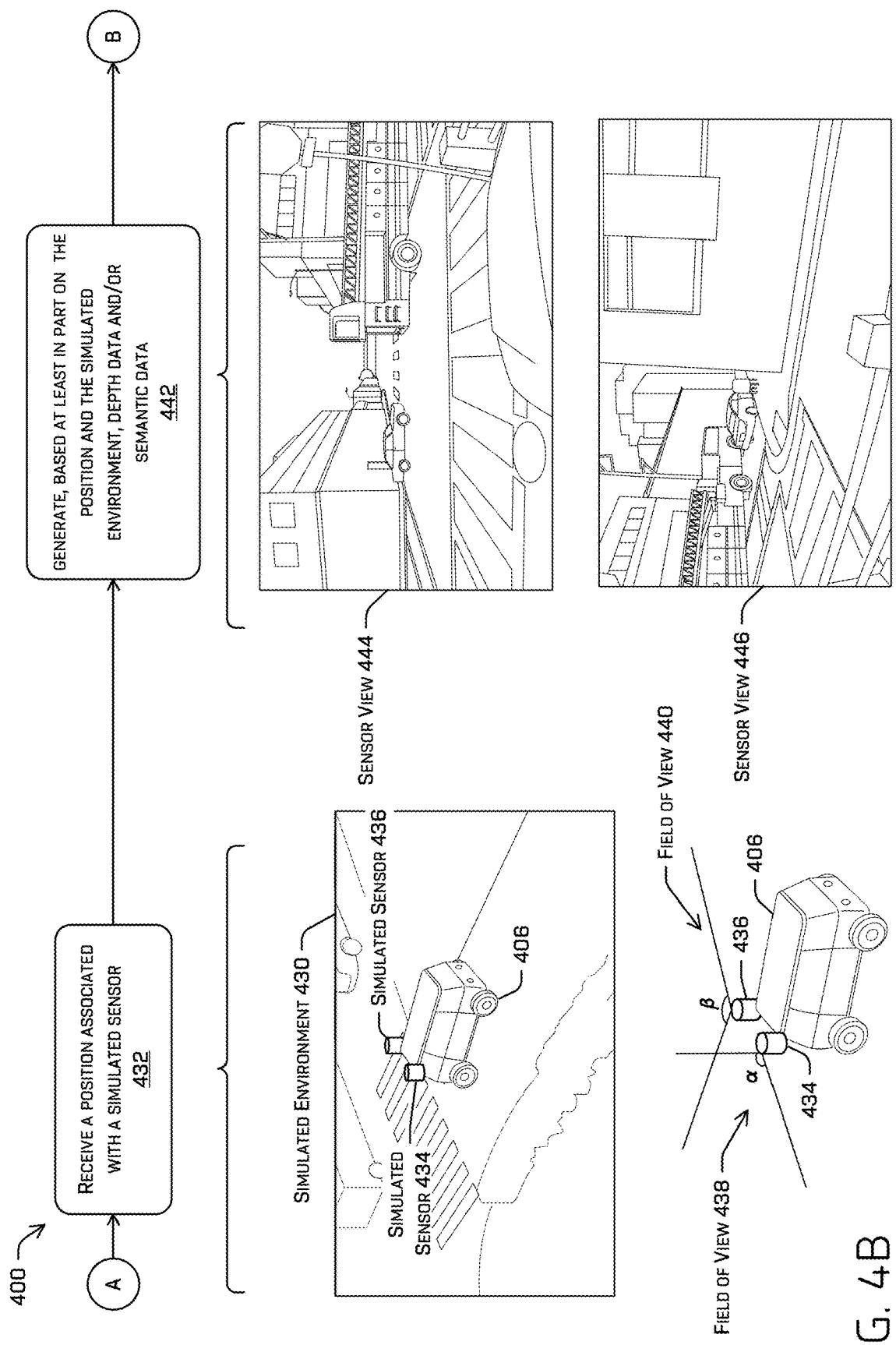

Passenger Vehicle 408
Oversized Vehicle 410
Building 412

SIMULATING OBJECT OCCLUSIONS

BACKGROUND

Former simulation techniques may represent the visibility of objects in a non-realistic manner and/or may require expensive resources to accurately simulate a scenario. In some cases, a simplistic simulator may not model the environment in which the simulated vehicle is operating. For example, object occlusions caused by the environment may fail to be represented accurately. In such examples, the simplistic simulator may provide data to a simulated vehicle regarding an object that would be occluded from the vehicle in the environment (such as may be occluded by a crest of a hill, by other objects, and the like). Additionally or alternatively, the simplistic simulator may inaccurately represent objects that cross each other from the perspective of a point of view. A small object moving between the point of view and a larger object may cause the larger object to vanish, even though the larger object would continue to be visible in a real-world scenario.

Although more resource-intensive simulation techniques may more accurately simulate occlusion, such techniques may require use of ten or more graphics processing units (GPUs), which may be costly to operate and/or which may be unavailable (e.g., typical computing systems do not comprise ten or more GPUs).

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

FIGS. 4A-4C illustrate an example process for simulating output of a perception component and/or determining realistic simulated object occlusions.

DETAILED DESCRIPTION

Figure 1:
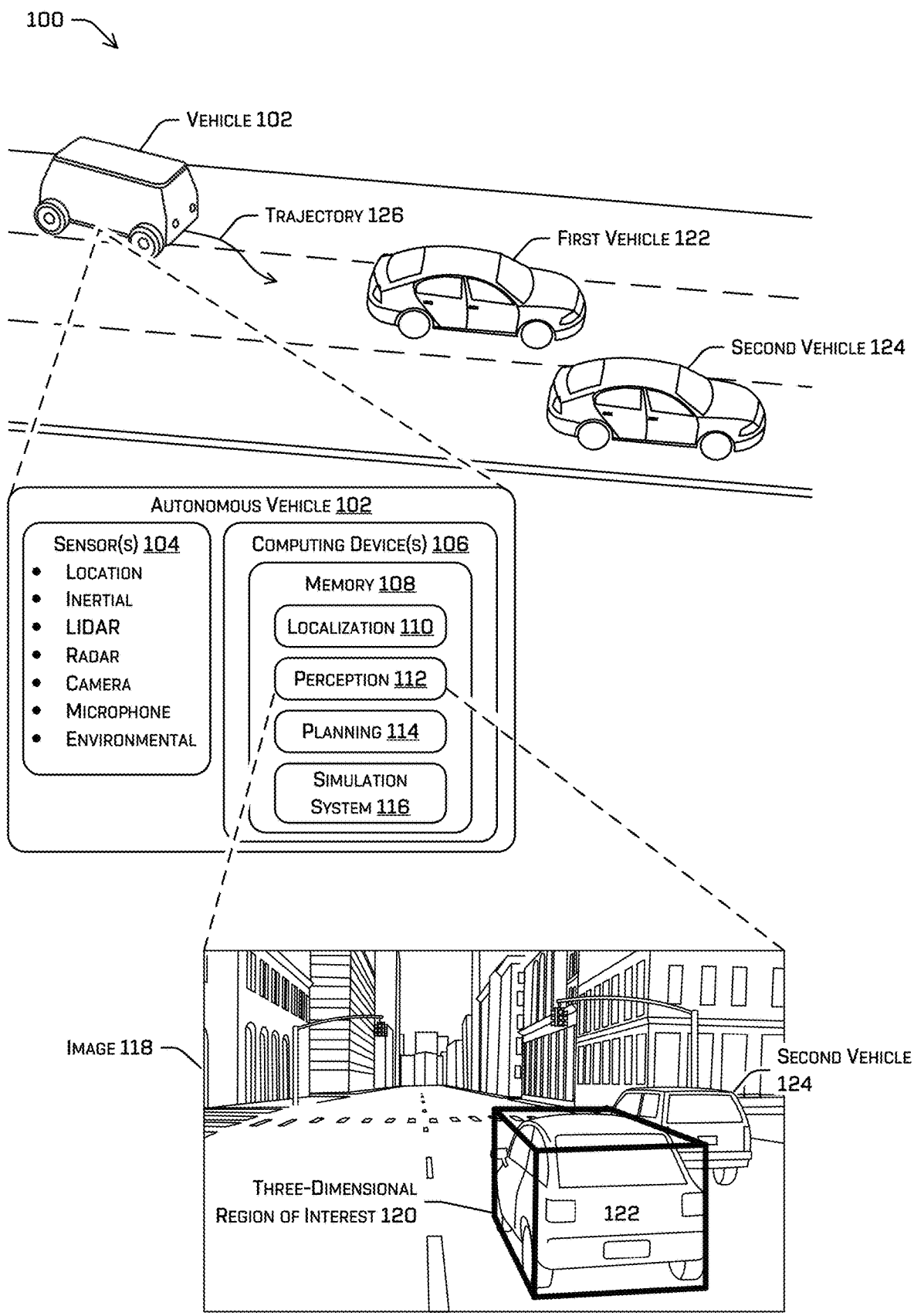
FIG. 1 illustrates an example scenario in which an autonomous vehicle may be controlled based at least in part on instructions generated by a planning component that receives perception data from a perception component.

Techniques for accurately simulating the occlusion of objects in a simulated environment may comprise simulating an output of a perception component of an autonomous vehicle without running the perception component, although in additional or alternate examples, the perception component may be run as part of the simulation. In some examples, the techniques discussed herein may comprise simulating an output of the perception component based at least in part on a simulated environment. In some examples, an autonomous vehicle may comprise one or more sensors, a perception component, and/or planning component, among others. Put simply, the sensors may gather data from the environment surrounding the autonomous vehicle, the perception component may determine, based at least in part on sensor data, what is in the environment surrounding the autonomous vehicle and the planning component may determine how to operate the autonomous vehicle based at least in part on data received from the perception component identifying characteristics of the surrounding environment.

One or more computing devices may determine a simulation of the environment and/or the autonomous vehicle. For example, the simulation may comprise a representation of a position, orientation, movement, and/or quality of portions of the environment and/or the autonomous vehicle. The environment may comprise an agent, such as another vehicle, a pedestrian, vegetation, a building, signage, and/or the like. Simulation may be used to test operation of various components of the vehicle. In some examples, simulation may be used to test the planning component of the autonomous vehicle based at least in part on providing data from the simulation to the perception component and/or the planning component. In some examples, the perception component may comprise a machine-learning (ML) pipeline trained to receive sensor data as input and to output perception data. The planning component may comprise a second ML pipeline trained to receive the perception data and output instructions for controlling operation of the autonomous vehicle.

The techniques may comprise receiving a scenario, which may be defined based at least in part on map data, log data received from an autonomous vehicle and/or based at least in part on input received at a computing device (e.g., an individual may interact with a user interface of the computing device to define the scenario). In some examples, the scenario may indicate characteristics of the environment such as, for example, a position, orientation, movement, and/or characteristics (e.g., materials, height, width, depth, luminance) of one or more objects. For example, the environment may comprise one or more static objects and/or one or more agents (e.g., dynamic objects).

In some examples, the scenario may be generated by a simple simulator and may comprise a position, orientation, simple geometry (e.g., a first rectangle or box representing a vehicle, a second rectangle or box representing a pedestrian) and/or movement of one or more objects in the environment. In some examples, the scenario may lack data about the environment and/or may only comprise limited (e.g., two-dimensional) information about the environment. The scenario generated by the simple simulator may inaccurately represent object occlusions, whether by causing portion(s) of an occluded object to disappear that should be within view or by causing an occluded object to be visible that shouldn't be visible at all. In some examples, the scenario generated by the simple simulator may comprise a two-dimensional region of interest (e.g., a bounding box) associated with an object in the environment.

The techniques may additionally or alternatively comprise determining a three-dimensional representation of the environment (and/or any object contained therein) (i.e., a simulated environment) based at least is part on the scenario. In some examples, the three-dimensional representation may comprise position, orientation, geometric data (e.g., a polygon representation, a digital wire mesh representation) and/or movement data associated with one or more objects of the environment and/or may lack material, lighting, and/or lighting data, although in other examples this data may be included. In some examples, the scenario may be used to instantiate a three-dimensional representation of the object and/or the simulated environment may be instantiated based at least in part on map data (e.g., which may define a topology of the environment; the location and/or dimensions of fixtures such as signage, plants, and/or buildings) and/or the scenario data.

The techniques may additionally or alternatively comprise generating a depth buffer. In some examples, generating the depth buffer may be based at least in part on a simulated sensor position and/or simulated field of view associated with the simulated sensor. For example, the depth data (e.g., a pixel associated with the depth buffer) may comprise a distance from the simulated sensor position to a simulated surface in the environment (that is within the simulated field of view of the simulated sensor). The depth data may be associated with pixels or other portions of the simulation (e.g., locations in memory). In some examples, the depth buffer may alternatively identify a position of the surface in the environment, i.e., the depth buffer may be replaced by a position buffer, or the position buffer may be additionally generated. Generating the depth (and/or position) buffer may comprise rasterization and/or ray-tracing based at least in part on a position of and/or field of view associated with the simulated sensor.

The techniques may additionally or alternatively comprise associating an identifier of an object type with pixels of the depth buffer. For example, the techniques may comprise determining an identifier associated with a pixel based at least in part on a surface associated with the pixel (e.g., the surface may be associated with the pixel when the depth buffer is generated, e.g., by rasterization and/or ray-casting). In some examples, each object and/or portion of the simulated environment may be associated with an identifier. For example, the depth data may be associated with a pixel and identify a distance from a simulated camera to part of a building and semantic data (e.g., an identifier) may identify the pixels as being associated with the object type "building."

The techniques may additionally or alternatively comprise determining, based at least in part on the three-dimensional representation, a three-dimensional region of interest (ROI) associated with an object represented in the three-dimensional representation and/or motion data associated therewith, such as a current, predicted, and/or previous velocity, acceleration, heading, and/or the like; a static map identifying one or more static objects in the three-dimensional representation; and/or an occlusion grid identifying one or more portions of the environment that are obscured from the field of view of the simulated sensor.

In some examples, three-dimensional ROI and/or motion data, static map, and/or occlusion grid may be a simulation of data output by a perception component. The three-dimensional ROI and/or motion data, static map, and/or occlusion grid may be provided as input to a planning component. The planning component may generate instructions for controlling a vehicle and/or a simulated vehicle based at least in part on the three-dimensional ROI and/or motion data, static map, and/or occlusion grid. The instructions may be used to control the vehicle and/or the simulated vehicle. In some examples, the simulation may iteratively repeat the operations discussed herein per each time step of a simulated scenario. In some examples, the techniques discussed herein may be used to test and/or train the planning component.

In some examples, an autonomous vehicle (e.g., a planning component of an autonomous vehicle) may generate a trajectory for controlling operation of the autonomous vehicle based at least in part on the three-dimensional ROI and/or motion data, static map, and/or occlusion grid determined by the techniques discussed herein. From frame to frame (e.g., from time step to time step), the three-dimensional ROI associated with an object may jitter (e.g., move and/or change dimensions) in a manner similar to a three-dimensional ROI generated by the perception component. Accordingly, the three-dimensional ROI and/or motion data, static map, and/or occlusion grid may test and/or train the planning component more suitably than the simple simulation component since the simulated perception data more clearly simulates output of a perception component than perfect and/or impossible data about the environment. Moreover, the three-dimensional ROI and/or motion data and occlusion grid may accurately represent real-world occlusions. For example, the three-dimensional ROI may shrink and/or disappear as the object associated therewith is occluded from a line of sight of the simulated sensor by topology of the environment, a building of the environment, and/or another object of the environment.

The techniques may improve the testing and/or training of one or more components of the autonomous vehicle (e.g., a localization component, a perception component, a planning component) and may thereby improve the accuracy thereof and the safety and efficacy of operation of the autonomous vehicle (or any other system that integrates such a perception component and/or planning component). Moreover, the techniques may reduce the amount of computing resources needed to accurately simulate a scenario and/or test and/or train components of an ML pipeline that receive sensor data from an environment or receive data derived from such sensor data.

Example Scenario

FIG. 1 illustrates an example scenario 100 including a vehicle 102. In some examples, the example scenario 100 may be a real-world scenario and/or the example scenario 100 may be a representation of a real-world scenario modeled as a simulated scenario. In examples where the example scenario 100 is a simulated scenario, the example scenario 100 may be determined based at least in part on input received at a user interface of a computing device (e.g., a user of the computing device may define the environment, objects therein, and/or characteristics thereof) and/or the example scenario 100 may be based at least in part on log data received from one or more autonomous vehicles. The log data may be based at least in part on sensor data received at an autonomous vehicle, perception data generated by a perception component, and/or instructions generated by a planning component. In some examples, the autonomous vehicle may store the log data and/or periodically transmit the log data to a remote computing device.

In some instances, the vehicle 102 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 102 may be a fully or partially autonomous vehicle having any other level or classification. It is contemplated that the techniques discussed herein may apply to more than robotic control, such as for autonomous vehicles. For example, the techniques discussed herein may be applied to mining, manufacturing, augmented reality, etc. Moreover, even though the vehicle 102 is depicted as a land vehicle, vehicle 102 may be a spacecraft, watercraft, and/or the like. In some examples, vehicle 102 may be represented in a simulation as a simulated vehicle. For simplicity, the discussion herein does not distinguish between a simulated vehicle and a real-world vehicle. References to a "vehicle" may therefore reference a simulated and/or a real-world vehicle.

According to the techniques discussed herein, the vehicle 102 may receive sensor data from sensor(s) 104 of the vehicle 102. For example, the sensor(s) 104 may include a location sensor (e.g., a global positioning system (GPS) sensor), an inertia sensor (e.g., an accelerometer sensor, a gyroscope sensor, etc.), a magnetic field sensor (e.g., a compass), a position/velocity/acceleration sensor (e.g., a speedometer, a drive system sensor), a depth position sensor (e.g., a lidar sensor, a radar sensor, a sonar sensor, a time of flight (ToF) camera, a depth camera, and/or other depth-sensing sensor), an image sensor (e.g., a camera), an audio sensor (e.g., a microphone), and/or environmental sensor (e.g., a barometer, a hygrometer, etc.). In some examples, a simulated sensor may correspond with at least one of the sensor(s) 104 on the vehicle 102. In some examples, the position of a simulated sensor may correspond with a relative position of one of the sensor(s) 104 to the vehicle 102.

The sensor(s) 104 may generate sensor data, which may be received by computing device(s) 106 associated with the vehicle 102. However, in other examples, some or all of the sensor(s) 104 and/or computing device(s) 106 may be separate from and/or disposed remotely from the vehicle 102 and data capture, processing, commands, and/or controls may be communicated to/from the vehicle 102 by one or more remote computing devices via wired and/or wireless networks.

Computing device(s) 106 may comprise a memory 108 storing a localization component 110, a perception component 112, a planning component 114, and/or a simulation system 116. In general, localization component 110 may comprise software and/or hardware system(s) for determining a pose (e.g., position and/or orientation) of the vehicle 102 relative to one or more coordinate frames (e.g., relative to the environment, relative to a roadway, relative to an inertial direction of movement associated with the autonomous vehicle).

The perception component 112 may determine what is in the environment surrounding the vehicle 102 and the planning component 114 may determine how to operate the vehicle 102 according to information received from the localization component 110 and/or the perception component 112. The localization component 110, the perception component 112, and/or the planning component 114 may include one or more machine-learned (ML) models and/or other computer-executable instructions.

In some examples, the localization component 110 and/or the perception component 112 may receive sensor data from the sensor(s) 104 and/or simulated data from simulation system 116. The techniques discussed herein may comprise adding to or replacing the sensor data received from sensor(s) 104. For example, the simulation system 116 may generate a two-dimensional or three-dimensional representation of the scenario 100 and provide at least a portion of the representation to the localization component 110 and/or the perception component 112 in at least one example. In an additional or alternate example, the simulation system 116 may replace or run parallel to the perception component 112 and may simulated perception data to the planning component 114.

In some instances, the perception component 112 may additionally or alternatively determine data related to objects in the vicinity of the vehicle 102 (e.g., classifications associated with detected objects, instance segmentation(s), tracks), route data that specifies a destination of the vehicle, global map data that identifies characteristics of roadways (e.g., features detectable in different sensor modalities useful for localizing the autonomous vehicle), local map data that identifies characteristics detected in proximity to the vehicle (e.g., locations and/or dimensions of buildings, trees, fences, fire hydrants, stop signs, and any other feature detectable in various sensor modalities), etc. In some examples, the objects surrounding the vehicle 102 may be simulated objects of a simulated environment. The data produced by the perception component 112 may be collectively referred to as "perception data." Once the perception component 112 has generated perception data, the perception component 112 may provide the perception data to the planning component 114.

FIG. 1 depicts an example image 118, which may be part of the sensor data received from the sensor(s) 104. In some examples, the perception component 112 may determine perception data associated with the image 118 and/or the simulation system 116 may determine simulated perception data associated with the image 118. For example, the perception component 112 may determine a three-dimensional ROI 120 associated with an object (i.e., first vehicle 122) depicted in the image 118 based at least in part on sensor data received from the one or more sensors. In an additional or alternate example, the simulation system 116 may determine the three-dimensional ROI 120 based at least in part on the techniques discussed herein.

FIG. 1 also depicts one of the issues that may arise with simplistic simulators. In a scenario such as scenario 100 where a first object partially occludes a second object, i.e., the first vehicle 122 partially occludes a second vehicle 124, a simplistic simulator may cause the second vehicle 124 to disappear, e.g., by not rendering the second vehicle 124 and/or by not generating an ROI associated with the second vehicle 124, or the simplistic simulator may relay data regarding the entirety of the second vehicle 124 to the planning component 114, even when the second vehicle 124 should be completely occluded. This may hamper training and/or testing the planning component and/or may cause a safety issue for operation of the vehicle 102 if output of the simplistic simulator is received as input by the planning component 114. In some examples, the perception component 112 may accurately generate a three-dimensional ROI and/or other perception data associated with the second vehicle 124 (e.g., position, velocity, acceleration, heading)—such as by generating a three-dimensional ROI that is smaller than a size of the object and/or multiple three-dimensional ROIs for those portions of the object that are visible, but the simplistic simulator may be incapable of this—the simplistic simulator may represent objects as binarily being present or not present in the scene and may account occluded objects as not being present.

In an additional or alternate example, the simplistic simulator may inaccurately represent the scenario 100 by transmitting simulated perception data related to the second vehicle 124 to the planning component 114 that couldn't be identifiable from sensor data. For example, in the depicted example, the simplistic simulator may generate simulated perception data related to the front left corner of the second vehicle 124 that is obscured by the first vehicle 122. Additional and alternate inaccuracies are discussed regarding FIGS. 2A and 2B. Additionally or alternatively the simplistic simulator may transmit simulated perception data related to fully occluded objects to the planning component 114. To robustly test and/or train the planning component 114 without using the perception component 112, the simulated perception data determined by the simulation system 116 should be as similar to the perception data generated by the perception component 112 as possible. The simplistic simulator may not robustly test and/or train the planning component 114.

The planning component 114 may use the perception data and/or simulated perception data received from perception component 112 and/or simulation system 116, to determine one or more trajectories, control motion of the vehicle 102 to traverse a path or route, and/or otherwise control operation of the vehicle 102, though any such operation may be performed in various other components (e.g., localization may be performed by the localization component 110, which may be based at least in part on perception data and/or simulated perception data). For example, the planning component 114 may determine a route for the vehicle 102 from a first location to a second location; generate, substantially simultaneously and based at least in part on the perception data and/or the simulated perception data, a plurality of potential trajectories for controlling motion of the vehicle 102 in accordance with a receding horizon technique (e.g., 1 micro-second, half a second) to control the vehicle to traverse the route (e.g., in order to avoid any of the detected objects); and select one of the potential trajectories as a trajectory 126 of the vehicle 102 that may be used to generate a drive control signal that may be transmitted to drive components of the vehicle 102. FIG. 1 depicts an example of such a trajectory 126, represented as an arrow indicating a heading, velocity, and/or acceleration, although the trajectory itself may comprise instructions for a PID controller, which may, in turn, actuate a drive system of the vehicle 102.

Example Simulator Errors

Figure 2A:
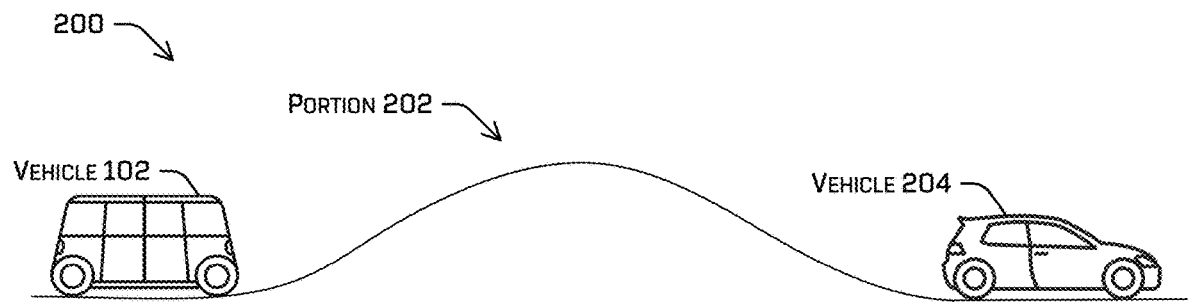
FIGS. 2A and 2B illustrate example scenarios in which former simulation techniques may inaccurately represent occlusion of an object.
Figure 2B:
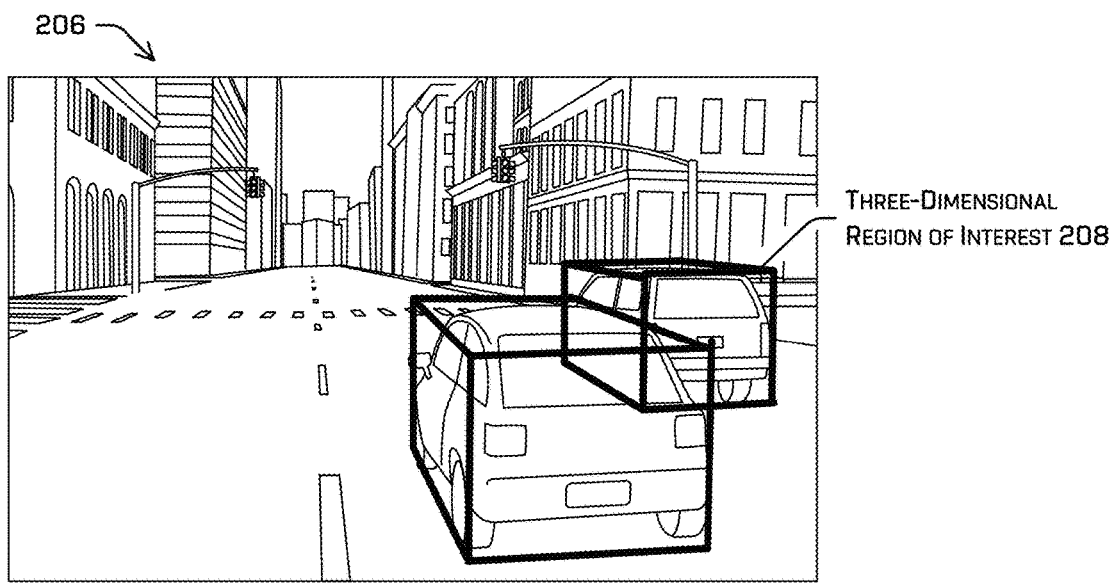

FIGS. 2A and 2B illustrate example scenarios in which former simulation techniques may inaccurately represent occlusion of an object and/or inaccurately model output of a perception component. The scenarios may be simulated scenarios associated with a simulated environment and/or simulated objects contained therein. The simulation may correspond to real-world operations of an autonomous vehicle, log data, a procedurally generated scenario (e.g., based at least in part on a set of object types, map constraints (e.g., maximal and/or minimal curves, intersections, elevations), velocities, event types), and/or a scenario determined based at least in part on input received via a user interface.

FIG. 2A illustrates an example scenario 200 in which vehicle 102 approaches a portion 202 of the environment where elevation of a topology of the environment obscures a vehicle 204 from a line of sight of the vehicle 102 and/or sensor(s) thereof. In some examples, a simplistic simulator may transmit data (e.g., perception data) regarding the vehicle 204 to a planning component of the vehicle 102 before the vehicle 204 should be within the line of sight of the vehicle 102 or, in an additional or alternate example, the simplistic simulator may not transmit such data until the vehicle 204 is in full view (no portion thereof is obscured).

FIG. 2B depicts an example scenario 206 in which a three-dimensional ROI 208 is generated by the simplistic simulator in association with the second vehicle (124 in FIG. 1). In some examples, the perception component may, in fact, be able to generate such a three-dimensional ROI 208 when a portion of the second vehicle is obscured, although this may not always be the case (e.g., when LIDAR data is unavailable, when environmental topology and/or a building obscures the object, when most of the object is obscured, when the object is oriented such that a third dimension may not be inferred such as when an object has a heading that is parallel to primary axis of a field of view of a sensor, e.g., only the rear of a truck is visible so the length may not be in view).

Example System

Figure 3:
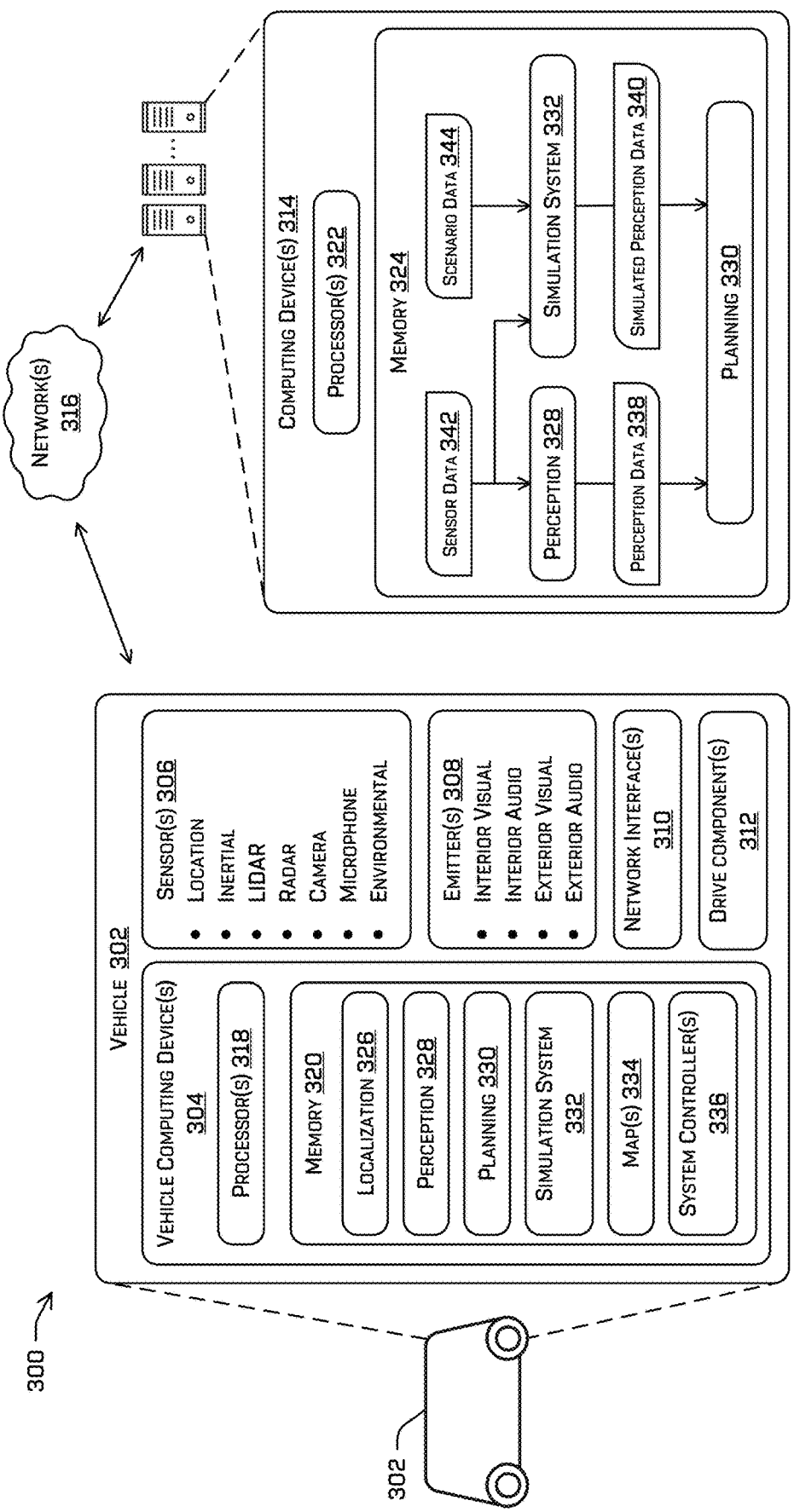
FIG. 3 illustrates a block diagram of an example system for correcting radar data for out-of-plane return error contributions, determining a velocity and/or position of an autonomous vehicle based at least in part on the corrected radar data, and/or controlling an autonomous vehicle based at least in part on the velocity and/or the position.

FIG. 3 illustrates a block diagram of an example system 300 that implements the techniques discussed herein. In some instances, the example system 300 may include a vehicle 302, which may represent the vehicle 102 in FIG. 1. In some instances, the vehicle 302 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 302 may be a fully or partially autonomous vehicle having any other level or classification. Moreover, in some instances, the techniques described herein may be usable by non-autonomous vehicles as well.

The vehicle 302 may include a vehicle computing device(s) 304, sensor(s) 306, emitter(s) 308, network interface(s) 310, and/or drive component(s) 312. Vehicle computing device(s) 304 may represent computing device(s) 106 and sensor(s) 306 may represent sensor(s) 104. The system 300 may additionally or alternatively comprise computing device(s) 314.

In some instances, the sensor(s) 306 may include lidar sensors, radar sensors, ultrasonic transducers, sonar sensors, location sensors (e.g., global positioning system (GPS), compass, etc.), inertial sensors (e.g., inertial measurement units (IMUs), accelerometers, magnetometers, gyroscopes, etc.), image sensors (e.g., red-green-blue (RGB), infrared (IR), intensity, depth, time of flight cameras, etc.), microphones, wheel encoders, environment sensors (e.g., thermometer, hygrometer, light sensors, pressure sensors, etc.), etc. The sensor(s) 306 may include multiple instances of each of these or other types of sensors. For instance, the radar sensors may include individual radar sensors located at the corners, front, back, sides, and/or top of the vehicle 302. As another example, the cameras may include multiple cameras disposed at various locations about the exterior and/or interior of the vehicle 302. The sensor(s) 306 may provide input to the vehicle computing device(s) 304 and/or to computing device(s) 314. In some examples, the simulated sensors discussed herein may correspond to a specific type of sensor and/or any of the sensors. The position associated with a simulated sensor, as discussed herein, may correspond with a position and/or point of origination of a field of view of a sensor (e.g., a focal point) relative the vehicle 302 and/or a direction of motion of the vehicle 302.

The vehicle 302 may also include emitter(s) 308 for emitting light and/or sound, as described above. The emitter(s) 308 in this example may include interior audio and visual emitter(s) to communicate with passengers of the vehicle 302. By way of example and not limitation, interior emitter(s) may include speakers, lights, signs, display screens, touch screens, haptic emitter(s) (e.g., vibration and/or force feedback), mechanical actuators (e.g., seatbelt tensioners, seat positioners, headrest positioners, etc.), and the like. The emitter(s) 308 in this example may also include exterior emitter(s). By way of example and not limitation, the exterior emitter(s) in this example include lights to signal a direction of travel or other indicator of vehicle action (e.g., indicator lights, signs, light arrays, etc.), and one or more audio emitter(s) (e.g., speakers, speaker arrays, horns, etc.) to audibly communicate with pedestrians or other nearby vehicles, one or more of which comprising acoustic beam steering technology.

The vehicle 302 may also include network interface(s) 310 that enable communication between the vehicle 302 and one or more other local or remote computing device(s). For instance, the network interface(s) 310 may facilitate communication with other local computing device(s) on the vehicle 302 and/or the drive component(s) 312. Also, the network interface (s) 310 may additionally or alternatively allow the vehicle to communicate with other nearby computing device(s) (e.g., other nearby vehicles, traffic signals, etc.). The network interface(s) 310 may additionally or alternatively enable the vehicle 302 to communicate with computing device(s) 314. In some examples, computing device(s) 314 may comprise one or more nodes of a distributed computing system (e.g., a cloud computing architecture).

The network interface(s) 310 may include physical and/or logical interfaces for connecting the vehicle computing device(s) 304 to another computing device or a network, such as network(s) 316. For example, the network interface(s) 310 may enable Wi-Fi-based communication such as via frequencies defined by the IEEE 300.11 standards, short range wireless frequencies such as Bluetooth®, cellular communication (e.g., 2G, 3G, 4G, 4G LTE, 5G, etc.) or any suitable wired or wireless communications protocol that enables the respective computing device to interface with the other computing device(s). In some instances, the vehicle computing device(s) 304 and/or the sensor(s) 306 may send sensor data, via the network(s) 316, to the computing device(s) 314 at a particular frequency, after a lapse of a predetermined period of time, in near real-time, etc.

In some instances, the vehicle 302 may include one or more drive components 312. In some instances, the vehicle 302 may have a single drive component 312. In some instances, the drive component(s) 312 may include one or more sensors to detect conditions of the drive component(s) 312 and/or the surroundings of the vehicle 302. By way of example and not limitation, the sensor(s) of the drive component(s) 312 may include one or more wheel encoders (e.g., rotary encoders) to sense rotation of the wheels of the drive components, inertial sensors (e.g., inertial measurement units, accelerometers, gyroscopes, magnetometers, etc.) to measure orientation and acceleration of the drive component, cameras or other image sensors, ultrasonic sensors to acoustically detect objects in the surroundings of the drive component, lidar sensors, radar sensors, etc. Some sensors, such as the wheel encoders may be unique to the drive component(s) 312. In some cases, the sensor(s) on the drive component(s) 312 may overlap or supplement corresponding systems of the vehicle 302 (e.g., sensor(s) 306).

The drive component(s) 312 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive component(s) 312 may include a drive component controller which may receive and preprocess data from the sensor(s) and to control operation of the various vehicle systems. In some instances, the drive component controller may include one or more processors and memory communicatively coupled with the one or more processors. The memory may store one or more components to perform various functionalities of the drive component(s) 312. Furthermore, the drive component(s) 312 may also include one or more communication connection(s) that enable communication by the respective drive component with one or more other local or remote computing device(s).

The vehicle computing device(s) 304 may include processor(s) 318 and memory 320 communicatively coupled with the one or more processors 318. Memory 320 may represent memory 108. Computing device(s) 314 may also include processor(s) 322, and/or memory 324. The processor(s) 318 and/or 322 may be any suitable processor capable of executing instructions to process data and perform operations as described herein. By way of example and not limitation, the processor(s) 318 and/or 322 may comprise one or more central processing units (CPUs), graphics processing units (GPUs), integrated circuits (e.g., application-specific integrated circuits (ASICs)), gate arrays (e.g., field-programmable gate arrays (FPGAs)), and/or any other device or portion of a device that processes electronic data to transform that electronic data into other electronic data that may be stored in registers and/or memory.

Memory 320 and/or 324 may be examples of non-transitory computer-readable media. The memory 320 and/or 324 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 320 and/or memory 324 may store a localization component 326, perception component 328, planning component 330, simulation system 332, map(s) 334, and/or system controller(s) 336. Localization component 326 may represent localization component 110, perception component 328 may represent perception component 112, planning component 330 may represent planning component 114, and/or simulation system 332 may represent simulation system 116.

In at least one example, the localization component 326 may include hardware and/or software to receive data from the sensor(s) 306 to determine a position, velocity, and/or orientation of the vehicle 302 (e.g., one or more of an x-, y-, z-position, roll, pitch, or yaw). For example, the localization component 326 may include and/or request/receive map(s) 334 of an environment and can continuously determine a location, velocity, and/or orientation of the autonomous vehicle within the map(s) 334. In some instances, the localization component 326 may utilize SLAM (simultaneous localization and mapping), CLAMS (calibration, localization and mapping, simultaneously), relative SLAM, bundle adjustment, non-linear least squares optimization, and/or the like to receive image data, lidar data, radar data, IMU data, GPS data, wheel encoder data, and the like to accurately determine a location, pose, and/or velocity of the autonomous vehicle. In some instances, the localization component 326 may provide data to various components of the vehicle 302 to determine an initial position of an autonomous vehicle for generating a trajectory and/or for generating map data, as discussed herein. In some examples, simulation system 332 may provide data to the localization component 326 (e.g., a three-dimensional representation of an environment, simulated sensor data, simulated perception data) and/or receive an output from the localization component 326 (e.g., localizing a simulated vehicle in the simulated environment, which may or may not correspond to a real vehicle and real environment, depending on the use of the simulation system 332).

In some instances, perception component 328 may comprise a primary perception system, a secondary perception system, and/or a prediction system implemented in hardware and/or software. The perception component 328 may detect object(s) in in an environment surrounding the vehicle 302 (e.g., identify that an object exists), classify the object(s) (e.g., determine an object type associated with a detected object), segment sensor data and/or other representations of the environment (e.g., identify a portion of the sensor data and/or representation of the environment as being associated with a detected object and/or an object type), determine characteristics associated with an object (e.g., a track identifying current, predicted, and/or previous position, heading, velocity, and/or acceleration associated with an object), and/or the like. Data determined by the perception component 328 is referred to as perception data 338.

The planning component 330 may receive a locale of the vehicle 302 from the localization component 326, perception data 338 from the perception component 328, and/or simulated perception data 340 from the simulation system 332 and may determine instructions for controlling operation of the vehicle 302 based at least in part on any of this data. In some examples, determining the instructions may comprise determining the instructions based at least in part on a format associated with a system with which the instructions are associated (e.g., first instructions for controlling motion of the autonomous vehicle may be formatted in a first format of messages and/or signals (e.g., analog, digital, pneumatic, kinematic) that the drive component(s) 312 may parse/cause to be carried out, second instructions for the emitter(s) 308 may be formatted according to a second format associated therewith). In some examples, where the planning component 330 is hardware/software-in-a-loop in a simulation (e.g., for testing and/or training the planning component 330), the planning component 330 may generate instructions which may be used to control a simulated vehicle. The planning component 330 may be part of the simulation system 332 in some examples.

The simulation system 332 may operate on the vehicle 302 and/or on the computing device(s) 314. For simplicity, a more detailed example of the simulation system 332 is depicted on the computing device(s) 314. The simulation system 332 may run parallel to the perception component 328 (as depicted in FIG. 3) or the simulation system 332 may replace the perception component 328.

Depending on how the simulation system 332 is being used, the simulation system 332 may receive sensor data 342 and/or scenario data 344. In an example where the simulated scenario is generated based at least in part on an environment the autonomous vehicle is traversing or log data, the simulation system 332 may receive sensor data 342 to determine a three-dimensional representation of the scenario. In some examples, the scenario data 344 may be procedurally generated as part of a combinatorial iteration through scenarios, received responsive to interaction with a user interface of the computing device(s) 314 (e.g., responsive to user input), and/or the like. In some examples, the scenario data 344 may modify characteristics of a scenario that is generated based on sensor data 342.

The scenario data 344 may comprise a two-dimensional representation of an environment associated with a scenario, objects contained therein, and characteristics associated therewith. For example, the scenario data 344 may identify a position of an object, an area occupied by the object, a velocity and/or acceleration associated with the object, whether the object is static or dynamic, an object type associated with the object (e.g., a classification such as "pedestrian," "bicyclist," "vehicle," "oversized vehicle," "traffic light," "traffic signage," "building," "roadway," "crosswalk, "sidewalk"), and/or other kinematic qualities associated with the object and/or the object type (e.g., a friction coefficient, an elasticity, a malleability). As regards the environment itself, the scenario data may identify a topology of the environment, weather conditions associated with the environment, a lighting state (e.g. sunny, cloudy, night), a location of light sources, and/or the like. In some examples, topology, fixed object (e.g., buildings, trees, signage) locations and dimensions, and/or the like associated with the scenario data 344 may be generated based at least in part on map(s) 334.

The simulation system 332 may determine simulated perception data 340 according to the techniques discussed herein. The simulation system 332 may determine simulated perception data 340 associated with scenario data 344. The simulated perception data 340 may comprise a three-dimensional ROI and/or motion data associated with a (simulated) object, a static map, and/or an occlusion grid. The static map may identify the position and area associated with static object(s) in a simulated environment instantiated by the simulation system 332 (e.g., based at least in part on the scenario data 344) and the occlusion grid may identify portion(s) of the environment that are occluded to the (simulated) sensor(s) of the (simulated) vehicle 302.

In some examples, the simulation system 332 may replace the perception component 328 by powering off the perception component 328, pausing execution of the perception component 328, not providing sensor data 342 to the perception component 328, and/or by modifying a publish-subscribe (pub-sub) network so that the planning component 330 does not subscribe to publication(s) of the perception component 328 and, instead, subscribes to publications of the simulation system 332. In some examples, the perception component 328 may not exist or may be removed. In some examples, removing, powering off, pausing, and/or modifying the pub-sub network may reduce power and/or computational bandwidth consumption on computing device(s) 304 and/or 314.

Testing and/or training the planning component 330 may be based at least in part on the simulated perception data 340. For example, the simulation system 332 may provide a safe and expeditious way of testing how the planning component 330 will react to various scenarios that the vehicle 302 may or may not have encountered during operation, and determining whether or not the planning component 330 generates safe and/or efficacious control instructions to navigate the scenarios.

In some examples, the simulation system 332 may additionally or alternatively store a ruleset and may determine whether the planning component 330 passed or failed a scenario based at least in part on the ruleset. The ruleset may be associated with the scenario data 344. In some examples, the simulation system 332 may record a version of the planning component 330 in association with a scenario identifier and/or an indication of whether the planning component 330 passed or failed. In an additional or alternate example, the simulation system 332 may determine a non-binary indication associated with performance of the planning component 330 (e.g., a score in addition to or instead of a pass/fail indication). The non-binary indication may be based at least in part on a set of weights associated with the ruleset.

The memory 320 and/or 324 may additionally or alternatively store a mapping system, a planning system, a ride management system, etc. Although perception component 328 and/or planning component 330 are illustrated as being stored in memory 320 (and/or 324), perception component 328 and/or planning component 330 may include processor-executable instructions, machine-learned model(s) (e.g., a neural network), and/or hardware.

As described herein, the localization component 326, the perception component 328, the planning component 330, the simulation system 332, and/or other components of the system 300 may comprise one or more ML models. For example, the localization component 326, the perception component 328, and/or the planning component 330 may each comprise different ML model pipelines. In some examples, an ML model may comprise a neural network. An exemplary neural network is a biologically inspired algorithm which passes input data through a series of connected layers to produce an output. Each layer in a neural network can also comprise another neural network, or can comprise any number of layers (whether convolutional or not). As can be understood in the context of this disclosure, a neural network can utilize machine-learning, which can refer to a broad class of such algorithms in which an output is generated based on learned parameters.

Although discussed in the context of neural networks, any type of machine-learning can be used consistent with this disclosure. For example, machine-learning algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (ID3), Chi-squared automatic interaction detection (CHAID), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet-50, ResNet-101, VGG, DenseNet, PointNet, and the like.

Memory 320 may additionally or alternatively store one or more system controller(s) 336, which may be configured to control steering, propulsion, braking, safety, emitters, communication, and other systems of the vehicle 302. These system controller(s) 336 may communicate with and/or control corresponding systems of the drive component(s) 312 and/or other components of the vehicle 302. For example, the planning component 330 may generate instructions based at least in part on perception data 338 generated by the perception component 328 and/or simulated perception data 340 and transmit the instructions to the system controller(s) 336, which may control operation of the vehicle 302 based at least in part on the instructions.

It should be noted that while FIG. 3 is illustrated as a distributed system, in alternative examples, components of the vehicle 302 may be associated with the computing device(s) 314 and/or components of the computing device(s) 314 may be associated with the vehicle 302. That is, the vehicle 302 may perform one or more of the functions associated with the computing device(s) 314, and vice versa.

Example Process

Figure 4A:
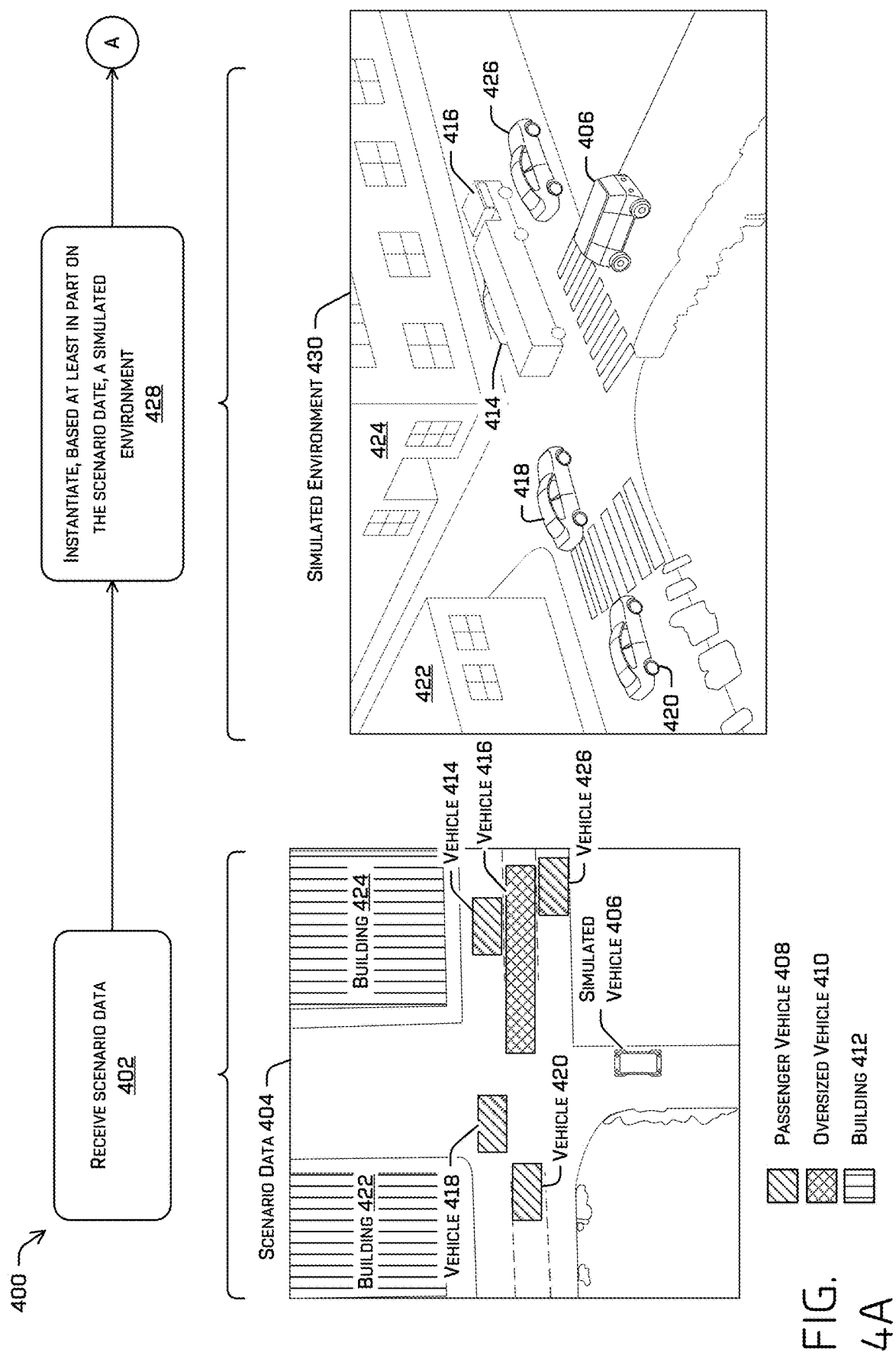
Figure 4C:
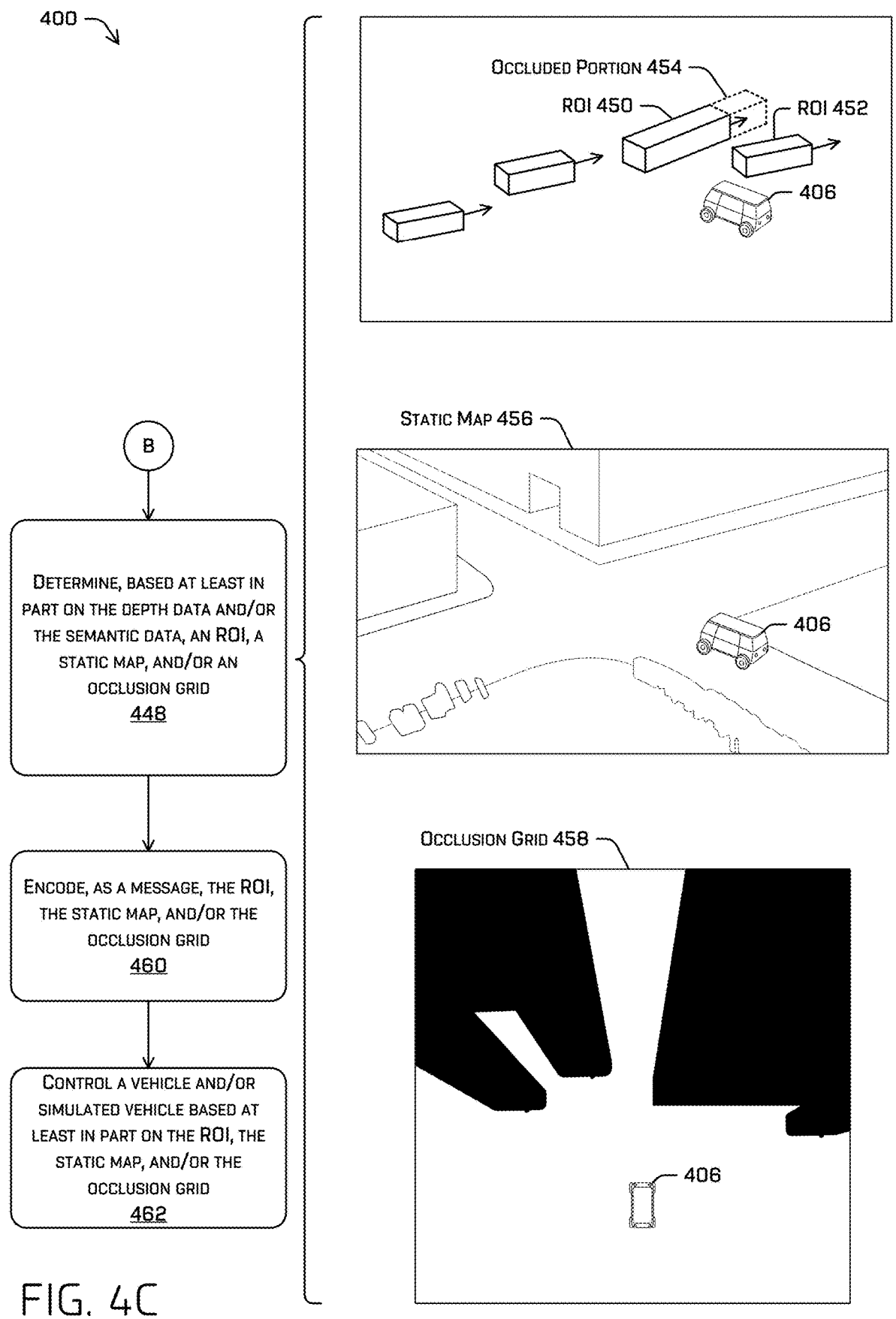

FIGS. 4A-4C illustrate an example process 400 for simulating output of a perception component of an autonomous vehicle and/or accurately simulating object occlusions. In some examples, example process 400 may be executed by a simulation system 332 during real-time operation of an autonomous vehicle, where the simulated vehicle and environment discussed below corresponds to the real-world autonomous vehicle and a real-world environment surrounding the autonomous vehicle. In other words, the example process 400 may be executed for a real-world, real-time scenario. In an additional or alternate example, example process 400 may be executed by the simulation system 332 in a fully or partially synthetic scenario, where the scenario is fully generated based at least in part on scenario instructions or partially using sensor data, respectively. The synthetic scenario may be executed in real or synthetic time. For example, a partially synthetic scenario may generate the scenario data based at least in part on real-time sensor data or based on log data.

Turning to FIG. 4A, at operation 402, example process 400 may comprise receiving scenario data, according to any of the techniques discussed herein. For example, a simple simulation component may generate the scenario data. In an addition or alternate data, the scenario data 344 may comprise sensor data 342 and/or scenario instructions. In some examples, the scenario data 404 may comprise a position, orientation, and/or characteristics of the simulated vehicle 406 in the environment, which may correspond to real-time operation of an autonomous vehicle and/or may correspond to simulated operation of the autonomous vehicle. In some examples, a planning component of the autonomous vehicle may generate instructions for controlling the simulated vehicle 406 in an agnostic manner to the simulation (e.g., the instructions generated by the planning component may be the same as those generated for a similar real-world situation). In some examples, a component may translate instructions generated by the planning component to instructions for controlling the simulated vehicle 406 in the simulated environment (e.g., updating a simulated state associated with the simulated vehicle 406, which may comprise a position, orientation, velocity, acceleration, heading, and/or the like associated with the simulated vehicle 406).

The scenario data 404 may additionally or alternatively comprise an indication of an object type associated with one or more objects (e.g., passenger vehicle 408, oversized vehicle 410, building 412) and/or characteristics associated with the one or more objects (e.g., a position, velocity, acceleration, heading, material type, kinematic coefficient). Note that the scenario data 404 is represented as a two-dimensional image, although, in additional or alternate examples, the scenario data 404 may comprise a data structure, such as a pub-sub message, and/or the like.

In some examples, providing the scenario data 404 as input to a planning component of the autonomous vehicle may not accurately model perception data received from the planning component at run time. For example, although vehicle 414 would be occluded by vehicle 416 from a line of sight of one or more sensors of the vehicle at run time, the scenario data 404 may not properly occlude vehicle 414 from a line of sight associated with simulated vehicle 406. In other words, the planning component may generate instructions for controlling the simulated vehicle 406 based at least in part on the scenario data 404, which included information about vehicle 414, which may not be feasible during real-world operation of an autonomous vehicle.

In the depicted example, scenario data 404 also includes data associated with vehicle 418, vehicle 420, building 422, building 424, and vehicle 426. Any dynamic object may be referred to as an agent. For example, an agent may comprise a vehicle, a bicyclist, pedestrian, a ball, a wind-blown plastic bag, and/or any other moveable object or object that is likely to move within a time period (e.g., a bench or table may be moveable but, in a time period relevant to simulation, is unlikely to move and may be considered a static object).

At operation 428, example process 400 may comprise instantiating, based at least in part on the scenario data, a simulated environment, according to any of the techniques discussed herein. Operation 428 may comprise procedurally generating the simulated environment 430 based at least in part on a set of template models associated with the object types. For example, the set of template models may comprise three different passenger vehicle models, four different pedestrian models, and/or the like. Any number of different models may exist. In some examples, a template model may comprise a three-dimensional model of a surface of an object without any texturing, although in additional or alternate examples, the model may comprise texture. The template model may comprise a polygon mesh, a triangle mesh, and/or the like. In some examples, models associated with dynamic objects may have a higher polygon count than models associated with static objects. For example, vehicle 418 may comprise a polygon mesh having a first polygon count and building 424 may comprise a polygon mesh having a second polygon count, where the first polygon count is greater than the second polygon count. In some examples, the simulated environment 430 may comprise surface models and lack lighting and/or textures. In additional or alternate examples, the simulated environment 430 may comprise lighting and/or textures, but the techniques described herein work without lighting and/or textures. The simulated environment 430 may comprise a model of the simulated vehicle 406. In some examples, instantiating the environment portion of the simulated environment may be based at least in part on map data and objects in the environment may be based at least in part on instructions received as part of the scenario data (e.g., instructions generated based at least in part on user selection(s) and/or interaction with a user interface, procedurally-generated instructions).

Turning to FIG. 4B, at operation 432, example process 400 may comprise receiving a position associated with a simulated sensor, according to any of the techniques discussed herein. In some examples, the simulated sensor may be associated with the simulated vehicle 406 and/or may correspond with a real-world relative position of a sensor to the autonomous vehicle. The position may be indicated as a position in the simulated environment 430 and/or a position relative to the simulated vehicle 406. For example, FIG. 4B comprises two simulated sensors, 434 and 436, respectively. Simulated sensor 434 and simulated sensor 436 may be associated with respective positions in the simulated environment 430 and/or respective positions relative to the simulated vehicle 406. The simulated sensor(s) may additionally or alternatively be associated with a sensor type (e.g., LIDAR, radar, RGB camera, depth camera, ultrasonic depth sensor) and/or a field of view (FOV). For example, simulated sensor 434 may be associated with FOV 438, a, and/or simulated sensor 436 may be associated with FOV 440, P. Although FOV 438 and FOV 440 are depicted as horizontal FOVs, it is understood that FOV 438 and FOV 440 may have a vertical and/or horizontal range.

As used herein, a surface of an object may be within a "line of sight" of the simulated vehicle 406 if the surface is within an FOV of at least one of the simulated sensors and nothing occludes the surface, whereas a surface may be out of a "line of sight" if the surface is outside a FOV of the simulated sensors or something occludes the surface. The line of sight may determined based at least in part on a rasterization and/or ray tracing algorithm. Similarly, a surface of an object may be within a "line of sight" of a sensor if the surface is within the sensor's FOV and the surface isn't occluded (e.g., by another portion of the object itself, by at least a portion of another object, by an environmental condition like fog).

At operation 442, example process 400 may comprise generating, based at least in part on the position and the simulated environment, depth data and/or semantic data, according to any of the techniques discussed herein. Operation 442 may comprise rendering the depth data and/or semantic data associated with a simulated sensor based at least in part on a position and/or a FOV associated with the sensor. For example, FIG. 4B depicts a sensor view 444 of the simulated environment 430 associated with simulated sensor 434 and a sensor view 446 associated with the simulated sensor 436. In some examples, rendering the depth data may comprise generating a depth buffer and/or a position buffer by rasterizing and/or ray tracing and/or determining a projection based at least in part on the simulated sensor position and/or FOV (e.g., based at least in part on a projection matrix determined by the perception simulation component).

For example, rendering the depth data may comprise rasterizing a portion of the simulated environment 430 associated with a field of view of a simulated sensor (e.g., the portion of the simulated environment 430 associated with sensor view 444) based at least in part on a position and/or FOV of the simulated sensor. In some examples, the rasterization may result in an image like the image depicted in sensor view 444. In some examples, the rasterized (or ray-casted) image may comprise a set of pixels (or other portions), where each pixel may be associated with a different portion of the simulated environment 430. Rendering the depth data may comprise storing depth information associated with the subset of the simulated environment 430 associated with the set of pixels. For example, the depth data associated with a first pixel may comprise a distance from the simulated sensor to the portion of the simulated environment 430 with which the first pixel has been associated (by rasterization and/or ray casting). In some examples, the depth data may be stored in a depth buffer associated with sensor view 444 and/or instead of the sensor view 444. In an additional or alternate example, a pixel may identify a position of the surface within the environment.

Figure 5A:
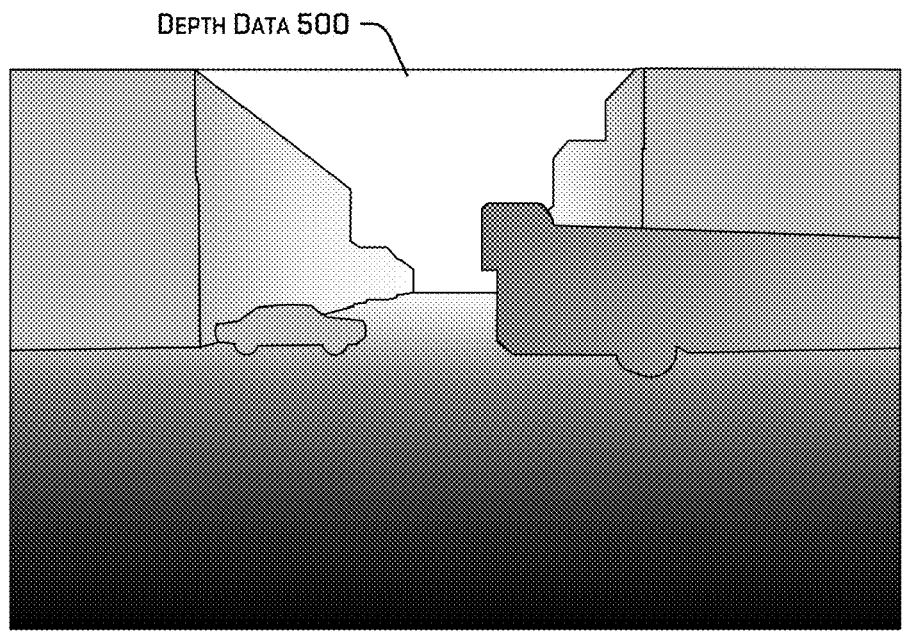
FIG. 5A illustrates example depth data rendered in association with a simulated environment.

FIG. 5A depicts example depth data 500 associated with simulated sensor 434 and/or sensor view 444. The example depth data 500 comprises depth values associated with respective pixels of the depth data 500 (where the pixels may be associated with respective portions of the simulated environment 430, as determined by rasterization, ray tracing, or the like). The depths are depicted in FIG. 5A according to a grayscale where darker values are closer to 0 and lighter values approach infinity or a pre-defined maximum distance associated with the sensor type (e.g., an upper range of an operating distance associated with the sensor type and/or position/FOV, x meters for LIDAR, y meters for radar, z meters for an RBG camera where x, y, and z may be the same or different).

Figure 5B:
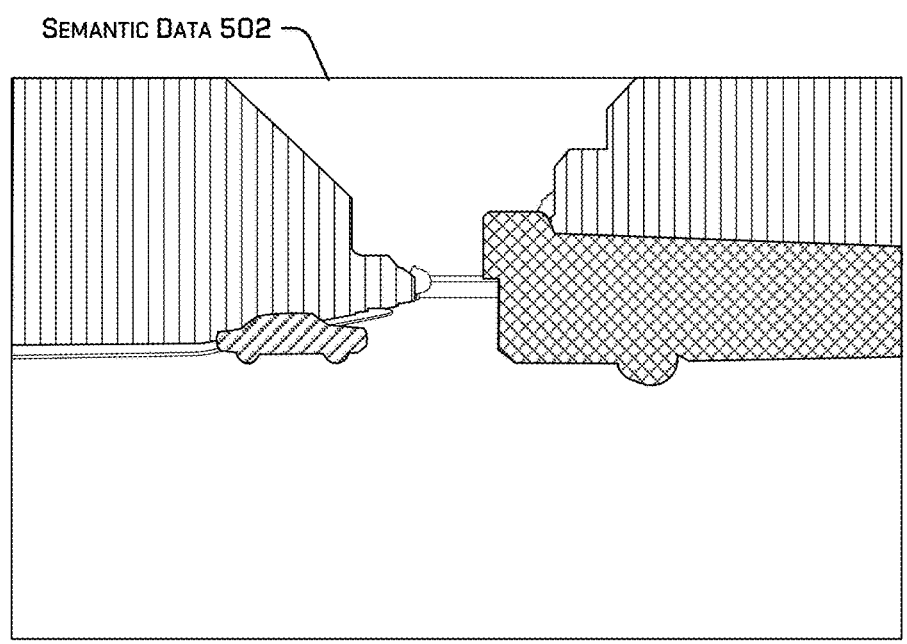
FIG. 5B illustrates example semantic data rendered in association with a simulated environment.
Figure 5B:
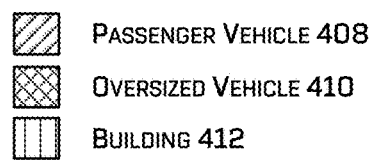

Determining the semantic data may comprise determining an object type associated with respective portions of the depth data 500 and/or sensor view. For example, a pixel of the depth data may be associated with a portion of a surface in the simulated environment 430. Determining the semantic data may comprise determining an object type associated with that surface and associating the object type with the pixel and/or the respective depth data. For example, associating an object type with the pixel may comprise associating an identifier with the pixel (e.g., the identifier may be a code symbolizing an object type, a string, and/or the like). FIG. 5B depicts example semantic data 502 associated with simulated sensor 434 and sensor view 444. In some examples, the semantic data may be instantiating in association with the simulated environment and the components thereof and generating the depth data may simultaneously comprise determining the semantic data associated with the surfaces associated with the pixels of a depth buffer and/or position buffer.

In sum, a resultant pixel and/or coordinate in the simulated space may be associated with a depth and/or an identifier (e.g., an object type/classification).

Turning to FIG. 4C, at operation 448, example process 400 may comprise determining, based at least in part on the depth data and/or the semantic data, a three-dimensional ROI, a static map, and/or an occlusion grid, according to any of the techniques discussed herein. Operation 448 may comprise running a shader over the depth data and/or the semantic data to determine a three-dimensional position associated with a pixel. In some examples, determining an ROI 450 may comprise determining a three-dimensional ROI associated with an object. For example, FIG. 4C depicts the three-dimensional ROI 450 as a bounding box. It is understood that any other ROI may be used, such as a mask, a bounding contour, and/or the like. Determining the three-dimensional ROI may comprise determining a subset of pixels (e.g., of the depth image) associated with a same identifier (e.g., based at least in part on the semantic data and a clustering algorithm, such as determining that the pixels are within a threshold distance of each other or any other suitable algorithm for identifying pixels associated with a same object type as being associated with a same or different object, by associating an identifier with each object in the three-dimensional simulation and determining contiguous regions having the same identifier) and determining an ROI that encapsulates three-dimensional positions associated with the subset of pixels. For example, the three-dimensional positions may be determined based at least in part on a shader that un-projects points associated with the groups of pixels based at least in part on the depth data, resulting in a set of three-dimensional points. In some examples, determining the ROI may comprise determining a minimum value and a maximum value of the set of three-dimensional points in one or more dimensions and determining a shape of the ROI that bounds the minimum value and the maximum value. In some examples, this minim/maximum determination may be determined by a shader. Determining the ROI 450 may additionally or alternatively comprise determining a position, velocity, acceleration, and/or heading (indicated as arrows in FIG. 4C) associated with the object over a period of multiple frames.

Note that, in FIG. 4C, the ROI 450 is shorter than the object indicated by the ROI (i.e., vehicle 416) because vehicle 426 occludes part of vehicle 416 from a line of sight of the simulated sensors. As such, the ROI 450 would include the occluded portion 454 if vehicle 426 was not positioned to occlude part of vehicle 416. ROI 452 is associated with vehicle 426. Also note that no ROI appears in association with vehicle 414 since vehicle 416 fully occludes vehicle 414. In an additional or alternate example, if vehicle 426 only occluded a middle portion of vehicle 416, two ROIs would be associated with vehicle 416 at either end of the occlusion caused by vehicle 426.

Moreover, although the ROIs depicted in FIG. 4C are depicted as boxes, the ROIs may be two-dimensional and/or may be any other shape. In some examples, a depth of an ROI (from the perspective of a simulated sensor) may be less than a depth of an object since the ROI may be generated based at least in part on three-dimensional points that are un-projections from the simulated environment 430 (e.g., since the simulated sensor may only "see" a portion of the object which may not include a surface of the object that is furthest away from the simulated sensor). This more closely models some perception components. Additionally or alternatively, the ROI may be determined based at least in part on an ML model and/or may be determined based at least in part on a depth estimated based at least in part on extents of visible portions of the object. In such an instance, the depth of the ROI may more closely match the true depth of the object.

For example, if the simulated vehicle was directly behind a semi-truck that was traveling in a same direction as the simulated vehicle (the length of the semi-truck was parallel to a length to the simulated vehicle), then an ROI generated in association with the semi-truck may have a depth that is less than the length of the semi-truck. In some examples, since the three-dimensional points determined from the depth data in association with the semi-truck may correspond to portions of the semi-truck that are within a line of sight of the one or more simulated sensors and may therefore include a point associated with a furthest surface of the semi-truck, from the perspective of the simulated sensor(s). In other examples, the ROI generated in association with the semi-truck may have a depth that is closer to the full length of the truck (e.g., where the perception simulation component comprises an ML model or other component to predict a depth of the object).

In some examples, determining an ROI may be based at least in part on multiple depth data/semantic data sets associated with different simulated sensors. For example, a first simulated sensor may be associated with first depth data and first segmentation data and a second simulated sensor may be associated with second depth data and second segmentation data. In some examples, determining that a subset of pixels is associated with an object may be based at least in part on the first depth data/segmentation data and the second depth data/segmentation data. The subset of pixels may thereby comprise pixels that are associated with both the first depth data/segmentation data and the second depth data/segmentation data. Determining an ROI associated with an object may be based at least in part on multiple sets of depth data and/or segmentation data associated with different simulated sensors.

Determining the static map 456 may comprise determining, based at least in part on the depth data and/or the segmentation data, a set of pixels associated one or more object types that are identified as static object types. Determining the static map may comprise identifying a portion of a map associated with the environment as being static. In some examples, the static map 456 may be two-dimensional or three-dimensional. In a two-dimensional instance, determining the static map 456 may comprise projecting depth data associated with a pixel into the two-dimensional space associated with the static map 456 and identifying the portion of the two-dimensional space into which the depth data was projected as being static if the semantic data identifies the pixel as being associated with a static object type. In an instance where the static map 456 is three-dimensional, a shader may un-project depth data associated with a pixel into the three-dimensional static map 456.

Determining the occlusion grid 458 may comprise determining portion(s) of the simulated environment, including instantiated objects, that are outside a line of sight of the simulated sensor(s). Although the occlusion grid 458 is depicted as being two-dimensional in FIG. 4C, the occlusion grid 458 may be three-dimensional. Determining the occlusion grid 458 may comprise determining an area or volume that is behind the three-dimensional points determined based at least in part on the depth data, from the perspective of the one or more simulated sensors. The depicted occlusion grid 458 indicates, in black, portions of the environment that are occluded to simulated sensor 434. An occlusion grid that is additionally based on simulated sensor 436 would indicate less of the environment as being occluded. The occlusion grid 458, static map 456, and/or ROIs may be based at least in part on depth data and/or semantic data associated with different simulated sensors. This data simulates data that may be generated by a perception component and received as input by other components, such as a planning component.

Although simulated vehicle 406 is depicted as part of the ROIs, static map, and occlusion grid, the simulated vehicle 406 may not be explicitly indicated therein. For example, an origin or orientation of a coordinate fame of the ROIs, static map, and occlusion grid may be based at least in part on a location and/or orientation of the simulated vehicle. In an additional or alternate example, a ROI associated with the simulated vehicle 406 may be part of the ROIs and a portion of the environment associated with at least a portion of the simulated vehicle 406 may be indicated as occluded in the occlusion grid.

At operation 460, example process 400 may comprise encoding, as a message, a ROI, static map, and/or occlusion grid, according to any of the techniques discussed herein. In some examples, the message may comprise a same format as a message indicating the scenario data. Encoding the message may comprise transforming the ROI, static map, and/or occlusion grid to a format that a planning component is capable of parsing.

At operation 462, example process 400 may comprise controlling a vehicle and/or simulated vehicle based at least in part on the ROI and/or motion data, static map, and/or occlusion grid, according to any of the techniques discussed herein. For example, a planning component may receive the ROI, static map, and/or occlusion grid and determine control instructions based thereupon. In some examples, the control instructions may be output to a simulation system that changes a state of the simulation based at least in part on the control instructions (e.g., causing a simulated vehicle to move and making corresponding changes related thereto in the simulation state) and/or the control instructions may be output to system controller(s) of a vehicle to control operation of a vehicle.

Note that, although the example process 400 is depicted as sequential operations, it is understood that the operations discussed herein may be performed in a different order, simultaneously, and/or by one or more devices. Moreover, example process 400 may comprise additional, alternate, or less operations.

Example Clauses

A. A method comprising: receiving scenario data indicating at least a first position of an object to instantiate within a simulated environment and an identifier associated with the object; instantiating, in the simulated environment, a three-dimensional representation of the object; receiving a second position associated with a simulated sensor in the simulated environment; generating depth data indicative of distances to surfaces in the simulated environment relative to the second position; determining a portion of the depth data associated with the identifier; determining, based at least in part on the portion of the depth data, a three-dimensional bounding box associated with at least a portion of the object, the three-dimensional bounding box comprising a size and a position; and controlling, based at least in part on the three-dimensional bounding box, a simulated vehicle.

B. The method of paragraph A, wherein: the object is a first object, the first object is at least partially occluded by a second object, and the three-dimensional bounding box is smaller than a size of the first object.

C. The method of either paragraph A or B, wherein: generating the depth data comprises generating, based at least in part on the second position and the three-dimensional representation of the object, a depth buffer; and the method further comprises associating the identifier with one or more pixels of the depth buffer associated with the object.

D. The method of any one of paragraphs A-C, wherein determining the three-dimensional bounding box comprises determining a subset of the one or more pixels of the depth buffer associated with the identifier.

E. The method of any one of paragraphs A-D, wherein the method further comprises: determining, based at least in part on the depth data, a static map identifying one or more static objects in the environment; and determining, based at least in part on the depth data, an occlusion grid identifying one or more portions of the environment that are occluded from a field of view associated with the simulated sensor located at the second position, wherein controlling the simulated vehicle is further based at least in part on the static map and the occlusion grid.

F. The method of any one of paragraphs A-E, wherein: instantiating the simulated environment comprises instantiating terrain comprising elevation changes; the object is at least partially occluded by at least a portion of the terrain, and the three-dimensional bounding box is smaller than a size of the object.

G. A system comprising: one or more sensors; one or more processors; and a memory storing processor-executable instructions that, when executed by the one or more processors, cause the system to perform operations comprising: receiving scenario data indicating at least a first position of an object within a simulated environment and an identifier associated with the object; instantiating, in the simulated environment, a three-dimensional representation of the object; receiving a second position associated with a simulated sensor in the simulated environment; generating depth data indicative of distances to surfaces in the simulated environment relative to the second position; determining a portion of the depth data associated with the identifier; determining, based at least in part on the portion of the depth data, a three-dimensional region of interest associated with at least a portion of the object; and controlling, based at least in part on the three-dimensional region of interest, a simulated vehicle.

H. The system of paragraph G, wherein: the object is a first object, the first object is at least partially occluded by a second object, and the three-dimensional bounding box is smaller than a size of the first object.

I. The system of either paragraph G or H, wherein: generating the depth data comprises generating, based at least in part on the second position and the three-dimensional representation of the object, a depth buffer; and the operations further comprise associating the identifier with one or more pixels of the depth buffer associated with the object.

J. The system of any one of paragraphs G-I, wherein determining the three-dimensional region of interest comprises determining a subset of the one or more pixels of the depth buffer associated with the identifier.

K. The system of any one of paragraphs G-J, wherein determining the three-dimensional region of interest comprises: determining a subset of the first pixels associated with a first object identifier; and determining, based at least in part on the subset, extents associated with the subset.

L. The system of any one of paragraphs G-K, wherein the operations further comprise: determining, based at least in part on the depth data, a static map identifying one or more static objects in the environment; and determining, based at least in part on the depth data, an occlusion grid identifying one or more portions of the environment that are occluded from a field of view associated with the simulated sensor located at the second position, wherein controlling the simulated vehicle is further based at least in part on the static map and the occlusion grid.

M. The system of any one of paragraphs G-L, wherein: instantiating the simulated environment comprises instantiating terrain comprising elevation changes; the object is at least partially occluded by at least a portion of the terrain, and the three-dimensional bounding box is smaller than a size of the object.

N. A non-transitory computer-readable medium storing processor-executable instructions that, when executed by one or more processors, cause the one or more processors to perform operations comprising: receiving a first position of an object within a simulated environment and an identifier associated with the object; instantiating, in the simulated environment, a three-dimensional representation of the object; receiving a second position associated with a simulated sensor in the simulated environment; generating depth data indicative of distances to surfaces in the simulated environment relative to the second position; determining a portion of the depth data associated with the identifier; determining, based at least in part on the portion of the depth data, a three-dimensional region of interest associated with at least a portion of the object; and controlling, based at least in part on the three-dimensional region of interest, a simulated vehicle.

O. The non-transitory computer-readable medium of paragraph N, wherein: the object is a first object, the first object is at least partially occluded by a second object or a topology associated with the simulated environment, and the three-dimensional bounding box is smaller than a size of the first object.

P. The non-transitory computer-readable medium of either paragraph N or O, wherein: generating the depth data comprises generating, based at least in part on the second position and the three-dimensional representation of the object, a depth buffer; and the operations further comprise associating the identifier with one or more pixels of the depth buffer associated with the object.

Q. The non-transitory computer-readable medium of any one of paragraphs N-P, wherein determining the three-dimensional region of interest comprises determining a subset of the one or more pixels of the depth buffer associated with the identifier.

R. The non-transitory computer-readable medium any one of paragraphs N-Q, wherein determining the three-dimensional region of interest comprises: determining a subset of the first pixels associated with the object identifier and determining, based at least in part on the subset, extents associated with the subset.

S. The non-transitory computer-readable medium of any one of paragraphs N-R, wherein determining the three-dimensional region of interest comprises: determining a subset of the first pixels associated with a first object identifier; and determining, based at least in part on the subset, extents associated with the subset.

T. The non-transitory computer-readable medium of any one of paragraphs N-S, wherein the operations further comprise: determining, based at least in part on the depth data, a static map identifying one or more static objects in the environment; and determining, based at least in part on the depth data, an occlusion grid identifying one or more portions of the environment that are occluded from a field of view associated with the simulated sensor located at the second position, wherein controlling the simulated vehicle is further based at least in part on the static map and the occlusion grid.

While the example clauses described above are described with respect to one particular implementation, it should be understood that, in the context of this document, the content of the example clauses can also be implemented via a method, device, system, computer-readable medium, and/or another implementation. Additionally, any of examples A-T may be implemented alone or in combination with any other one or more of the examples A-T.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code components and/or computer-executable instructions executed by one or more computers or processors, hardware, or some combination thereof. Some or all of the methods may alternatively be embodied in specialized computer hardware.

At least some of the processes discussed herein are illustrated as logical flow graphs, each operation of which represents a sequence of operations that can be implemented in hardware, software, or a combination thereof. In the context of software, the operations represent computer-executable instructions stored on one or more non-transitory computer-readable storage media that, when executed by one or more processors, cause a computer or autonomous vehicle to perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
receiving scenario data indicating at least a first position of an object to instantiate within a simulated environment and an identifier associated with the object;
instantiating, in the simulated environment, a three-dimensional representation of the object;
receiving a second position associated with a first simulated sensor associated with a simulated vehicle in the simulated environment;
receiving a third position associated with a second simulated sensor associated with the simulated vehicle in the simulated environment;
generating, based at least in part on the first simulated sensor, first depth data indicative of distances to surfaces within at least a first line of sight associated the first simulated sensor in the simulated environment relative to the second position;
generating, based at least in part on the second simulated sensor, second depth data indicative of distances to surfaces within a at least a second line of sight associated with the second simulated sensor in the simulated environment relative to the third position;
determining that a portion of the first depth data is associated with the identifier;
determining that a portion of the second depth data is associated with the identifier;
determining, based at least in part on the portion of the first depth data and the portion of the second depth data being associated with the identifier, simulated perception data associated with the simulated vehicle comprising a three-dimensional bounding box associated with the portion of the first depth data and the portion of the second depth data, the three-dimensional bounding box representing a portion of the object that is within the first line of sight and the second line of sight, the three-dimensional bounding box comprising a size and a position; and
controlling, based at least in part on the simulated perception data, the simulated vehicle.

2. The method of claim 1, wherein:
the object is a first object,
the first object is at least partially occluded by a second object, and the method further comprising:
determining, based at least in part on the first object being partially occluded by the second object, that the three-dimensional bounding box is smaller than a size of the first object, the three-dimensional bounding box representing an unoccluded portion of the first object within the first line of sight and the second line of sight and not including an occluded portion of the first object.

3. The method of claim 1, wherein:
generating the first depth data comprises generating, based at least in part on the second position and the three-dimensional representation of the object, a depth buffer; and
the method further comprises associating the identifier with one or more pixels of the depth buffer associated with the object.

4. The method of claim 1, wherein the method further comprises:
determining, based at least in part on the first depth data, a static map identifying one or more static objects in the simulated environment; and
determining, based at least in part on the first depth data, an occlusion grid identifying one or more portions of the simulated environment that are occluded from a field of view associated with the first simulated sensor located at the second position,
wherein controlling the simulated vehicle is further based at least in part on the static map and the occlusion grid.

5. The method of claim 1, wherein the first simulated sensor is of a first sensor modality;
the second simulated sensor is of a second sensor modality; and
the determining the three-dimensional bounding box is based at least in part on fused sensor data from the first simulated sensor and the second simulated sensor.

6. The method of claim 1, wherein the first simulated sensor and the second simulated sensor are positioned proximate a first end of the simulated vehicle; and
wherein the first simulated sensor has a first field of view and the second simulated sensor has a second field of view, different than the first field of view.

7. The method of claim 1, wherein determining the three-dimensional bounding box further comprises at least one of:
determining that the portion of the first depth data and the portion of the second depth data comprise a contiguous region associated with the identifier; or
determining that a first pixel associated with the portion of the first depth data is within a threshold distance of a second pixel associated with the portion of the second depth data.

8. The method of claim 1, further comprising:
inputting the simulated perception data to a planning component associated with an autonomous vehicle;
generating, by the planning component and based at least in part on the three-dimensional bounding box, a control instruction; and
controlling the simulated vehicle based at least in part on the control instruction from the planning component.

9. The method of claim 8, further comprising:
determining, based at least in part on the controlling of the simulated vehicle or the control instruction, a performance of the planning component.

10. A system comprising:
one or more sensors;
one or more processors; and
a memory storing processor-executable instructions that, when executed by the one or more processors, cause the system to perform operations comprising:
receiving scenario data indicating at least a first position of an object within a simulated environment and an identifier associated with the object;
instantiating, in the simulated environment, a three-dimensional representation of the object;
receiving a second position associated with a first simulated sensor associated with a simulated vehicle in the simulated environment;
receiving a third position associated with a second simulated sensor associated with the simulated vehicle in the simulated environment;
generating, based at least in part on the first simulated sensor, first depth data indicative of distances to surfaces within at least a first line of sight associated with the first simulated sensor in the simulated environment relative to the second position;
generating, based at least in part on the second simulated sensor, second depth data indicative of distances to surfaces within at least a second line of sight associated with the second simulated sensor in the simulated environment relative to the third position;
determining that a portion of the first depth data is associated with the identifier;
determining that a portion of the second depth data is associated with the identifier;
determining, based at least in part on the portion of the first depth data and the portion of the second depth data being associated with the identifier, simulated perception data associated with the simulated vehicle comprising a three-dimensional region of interest associated with the portion of the first depth data and the portion of the second depth data, the three-dimensional region of interest representing at (cast a portion of the object that is within the first line of sight and the second line of sight; and
controlling, based at least in part on the simulated perception data, the simulated vehicle.

11. The system of claim 10, wherein:
the object is a first object,
the first object is at least partially occluded by a second object or a portion of terrain comprising elevation change, and the operations further comprise:
determining, based at least in part on the first object being at least partially occluded, that the three-dimensional region of interest is smaller than a size of the first object, the three-dimensional region of interest representing an unoccluded portion of the object within the first line of sight and the second line of sight and not including an occluded portion of the first object.

12. The system of claim 10, wherein:
generating the first depth data comprises generating, based at least in part on the second position and the three-dimensional representation of the object, a depth buffer; and
the operations further comprise associating the identifier with one or more pixels of the depth buffer associated with the object.

13. The system of claim 12, wherein determining the three-dimensional region of interest comprises determining a subset of the one or more pixels of the depth buffer associated with the identifier.

14. The system of claim 13, wherein determining the three-dimensional region of interest further determining, based at least in part on the subset, extents associated with the subset.

15. The system of claim 10, wherein the operations further comprise:
determining, based at least in part on the first depth data, a static map identifying one or more static objects in the simulated environment; and determining, based at least in part on the first depth data, an occlusion grid identifying one or more portions of the simulated environment that are occluded from a field of view associated with the first simulated sensor located at the second position, wherein controlling the simulated vehicle is further based at least in part on the static map and the occlusion grid.

16. A non-transitory computer-readable medium storing processor-executable instructions that, when executed by one or more processors, cause the one or more processors to perform operations comprising:

receiving a first position of an object within a simulated environment and an identifier associated with the object;

instantiating, in the simulated environment, a three-dimensional representation of the object;

receiving a second position associated with a first simulated sensor associated with a simulated vehicle in the simulated environment;

receiving a third position associated with a second simulated sensor associated with the simulated vehicle in the simulated environment;

generating, based at least in part on the first simulated sensor, first depth data indicative of distances to surfaces within at least a first line of sight associated with the first simulated sensor in the simulated environment relative to the second position;

generating, based at least in part on the second simulated sensor, second depth data indicative of distances to surfaces within at least a second line of sight associated with the second simulated sensor in the simulated environment relative to the third position;

determining that a portion of the first depth data is associated with the identifier;

determining that a portion of the second depth data is associated with the identifier;

determining, based at least in part on the portion of the first depth data and the portion of the second depth data being associated with the identifier, simulated perception data associated with the simulated vehicle comprising a three-dimensional region of interest associated with the portion of the first depth data and the portion of the second depth data, the three-dimensional region of interest representing a portion of the object that is within the first line of sight and the second line of sight; and controlling, based at least in part on the simulated perception data, the simulated vehicle.

17. The non-transitory computer-readable medium of claim 16, wherein:

the object is a first object, the first object is at least partially occluded by at least one of a second object or a topology associated with the simulated environment, and wherein the operations further comprise:

determining, based at least in part on the first object being at least partially occluded, that the three-dimensional region of interest is smaller than a size of the first object, the three-dimensional region of interest representing an unoccluded portion of the object within the first line of sight and the second line of sight and not including an occluded portion of the first object.

18. The non-transitory computer-readable medium of claim 16, wherein:

generating the first depth data comprises generating, based at least in part on the second position and the three-dimensional representation of the object, a depth buffer; and the operations further comprise associating the identifier with one or more pixels of the depth buffer associated with the object.

19. The non-transitory computer-readable medium of claim 18, wherein determining the three-dimensional region of interest comprises:

determining a subset of the one or more pixels associated with the identifier; and determining, based at least in part on the subset, extents associated with the subset.

20. The non-transitory computer-readable medium of claim 16, wherein the operations further comprise:

determining, based at least in part on the first depth data, a static map identifying one or more static objects in the simulated environment; and determining, based at least in part on the first depth data, an occlusion grid identifying one or more portions of the simulated environment that are occluded from a field of view associated with the first simulated sensor located at the second position, wherein controlling the simulated vehicle is further based at least in part on the static map and the occlusion grid.

* * * * *